(12) United States Patent
Tomisaka et al.

(10) Patent No.: US 7,268,008 B2
(45) Date of Patent: Sep. 11, 2007

(54) METHOD FOR MANUFACTURING PRESSURE SENSOR

(75) Inventors: Manabu Tomisaka, Nagoya (JP);
Yoshifumi Watanabe, Kariya (JP);
Hiroaki Tanaka, Kariya (JP)

(73) Assignee: DENSO Corporation, Kariya (JP)

( * ) Notice: Subject to any disclaimer, the term of this patent is extended or adjusted under 35 U.S.C. 154(b) by 57 days.

(21) Appl. No.: 11/325,514

(22) Filed: Jan. 5, 2006

(65) Prior Publication Data

US 2006/0160263 A1    Jul. 20, 2006

(30) Foreign Application Priority Data

Jan. 18, 2005 (JP) ............. 2005-010340
Oct. 14, 2005 (JP) ............. 2005-300299

(51) Int. Cl.
*H01L 21/00* (2006.01)

(52) U.S. Cl. ............. 438/48; 438/51; 438/53; 438/54; 438/55

(58) Field of Classification Search ........... 438/48, 438/51, 53, 54, 55
See application file for complete search history.

(56) References Cited

U.S. PATENT DOCUMENTS

| 5,595,939 A | 1/1997 | Otake et al. |
| 6,747,339 B1 * | 6/2004 | Mukai et al. ............ 257/643 |
| 2005/0034526 A1 | 2/2005 | Shinyama et al. |

OTHER PUBLICATIONS

U.S. Appl. No. 11/180,528, filed Jul. 14, 2005, Tanaka et al.

* cited by examiner

*Primary Examiner*—Hsien-Ming Lee
*Assistant Examiner*—Ankush Singal
(74) *Attorney, Agent, or Firm*—Posz Law Group, PLC

(57) ABSTRACT

A method for manufacturing a pressure sensor includes the steps of: preparing a semiconductor substrate; forming an insulation film on the substrate; forming a first metal film on the insulation film; forming a first protection film on the first metal film and the insulation film; forming a second protection film on the first metal film and the first protection film; performing reduction treatment of adhesive force on the second protection film, the force between the second protection film and a second metal film; forming the second metal film on the first metal film and the first protection film; and removing a part of the second metal film.

23 Claims, 4 Drawing Sheets

CORROSION

METHOD FOR MANUFACTURING PRESSURE SENSOR

CROSS REFERENCE TO RELATED APPLICATIONS

This application is based on Japanese Patent Applications No. 2005-10340 filed on Jan. 18, 2005, and No. 2005-300299 filed on Oct. 14, 2005, the disclosures of which are incorporated herein by reference.

FIELD OF THE INVENTION

The present invention relates to a method for manufacturing a pressure sensor.

BACKGROUND OF THE INVENTION

There has been proposed a structure in which a sensor element comprising semiconductor and a bonding portion that is electrically connected to a pad provided on the sensor element. The sensor element and the bonding portion are covered with a metal diaphragm into which oil is filled. This is disclosed in, for example, JP-A-H7-243926, which corresponds to U.S. Pat. No. 5,595,939.

In a pressure sensor having such a structure, once a fluid as a pressure medium is introduced through a pressure introduction hole provided in the pressure sensor, pressure of the fluid is applied to the sensor element via a metal diaphragm and oil. Therefore, the diaphragm provided in the sensor element is distorted, and a gage resistance formed in the diaphragm is thus transformed by compression stress or tensile stress. Thereby, a detection signal in accordance with the pressure of the fluid is outputted from the sensor element.

In the case of the pressure sensor having such a configuration, there are problems that the number of components is increased because the metal diaphragm is necessary, and a structure of the pressure sensor is complicated because a structure for sealing the oil using the metal diaphragm is necessary.

On the contrary, a structure where the metal diaphragm is eliminated can be considered. However, when such a structure is used, when the pressure sensor is used in a situation where the sensor element comprising semiconductor is exposed to a corrosive liquid, for example, the pressure sensor is used for measurement of differential pressure of DPF that is an exhaust cleaning filer of diesel-powered automobiles or pressure measurement in an atmosphere within an engine room, a problem that corrosion occurs because material of a bonding pad is Al.

Therefore, the applicants previously proposed a structure in which a bonding portion is covered with a gel protection layer, and a surface of a bonding pad comprising Al is coated by an Au plating film. Thereby, contact probability between a corrosion medium and the Al as an object to be corroded is reduced. Consequently, durability against pad corrosion can be improved. This is disclosed in Japanese Patent Application No. 2004-562923.

However, even if the above structure is used, it has been newly found that since adhesion between the protection film comprising SiN formed in the periphery of the pad and the Au film is not good, the corrosion medium that has penetrated through the gel protection layer through an interface between the Au film and the protection film enters a pad side, and therefore, the corrosion medium causes erosion.

SUMMARY OF THE INVENTION

In view of the above-described problem, it is an object of the present invention to provide a manufacturing method of a pressure sensor with high sealing performance.

A method for manufacturing a pressure sensor includes the steps of: preparing a semiconductor substrate having a sensor element thereon, the sensor element generating a detection signal in accordance with pressure as a detection object; forming an insulation film having a contact hole on a surface of the semiconductor substrate, the contact hole connecting to the sensor element; forming a first metal film on a predetermined part of the insulation film, the first metal film electrically connecting to the sensor element through the contact hole; forming a first protection film on the first metal film and the insulation film to expose a pad region of the first metal film; forming a second protection film made of organic resin on the first metal film and the first protection film to expose the pad region of the first metal film and a part of the first protection film disposed around the pad region; performing reduction treatment of adhesive force on a surface of the second protection film after the step of forming the second protection film, the adhesive force being between the second protection film and a second metal film thereon; forming the second metal film on the pad region of the first metal film and the part of the first protection film disposed around the pad region after the step of performing the reduction treatment; and removing a part of the second metal film disposed on the surface of the second protection film.

In the above method, the part of the second metal film on the second protection film is easily removed; and therefore, the other part of the second metal film adheres tightly on the first metal film and the first protection film so that sealing performance between the second metal film and the first metal film or the first protection film becomes higher. Thus, the sealing performance therebetween is improved; and therefore, corrosion medium is prevented from penetrating through an interface between the second metal film and the first protection film. Accordingly, no erosion occurs at a pad side.

Preferably, the step of performing the reduction treatment provides to increase adhesive force between the second metal film and the pad region of the first metal film or the part of the first protection film disposed around the pad region.

Preferably, the step of performing the reduction treatment of adhesive force is a plasma processing in a gas atmosphere including $CF_4$ gas and argon gas or nitrogen gas.

Preferably, the first metal film has a surface protrusion, a height of which is equal to or smaller than 0.5 μm. More preferably, the first metal film includes a titanium film and an aluminum based film. The step of forming the first metal film includes steps of: forming the titanium film; and forming the aluminum based film on the titanium film. The height of the surface protrusion is reduced by orientation of the titanium film. More preferably, the first metal film includes an aluminum-silicon-copper alloy film, and the height of the surface protrusion is reduced by thermal stability of the aluminum-silicon-copper alloy film.

Further, a method for manufacturing a pressure sensor includes the steps of: preparing a semiconductor substrate having a sensor element thereon, the sensor element generating a detection signal in accordance with pressure as a detection object; forming an insulation film having a contact hole on a surface of the semiconductor substrate, the contact hole connecting to the sensor element; forming a first metal film on a predetermined part of the insulation film, the first metal film electrically connecting to the sensor element through the contact hole; forming a first protection film on the first metal film and the insulation film to expose a pad region of the first metal film; forming a second protection film made of organic resin on the first metal film and the first protection film to expose the pad region of the first metal film and a part of the first protection film disposed around the pad region; performing increase treatment of adhesive force on a surface of the pad region of the first metal film and on the part of the first protection film disposed around the pad region after the step of forming the second protection film, the adhesive force being between the first metal film or the first protection film and a second metal film thereon; forming the second metal film on the pad region of the first metal film and the part of the first protection film disposed around the pad region after the step of performing the increase treatment; and removing a part of the second metal film disposed on the surface of the second protection film.

In the above method, the part of the second metal film adheres tightly on the first metal film and the first protection film so that sealing performance between the second metal film and the first metal film or the first protection film becomes higher. Thus, the sealing performance therebetween is improved; and therefore, corrosion medium is prevented from penetrating through an interface between the second metal film and the first protection film. Accordingly, no erosion occurs at a pad side.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
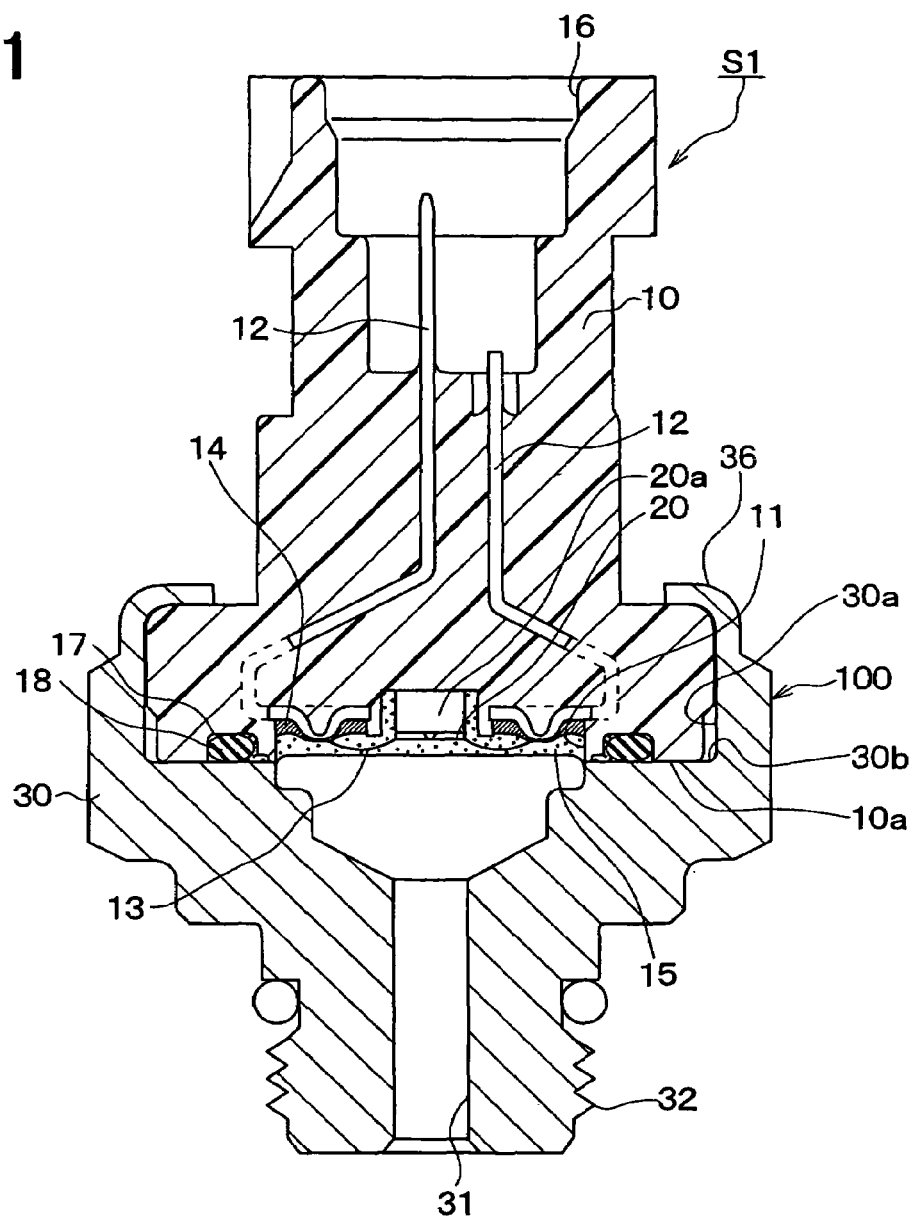
FIG. 1 is a cross sectional view showing a pressure sensor according to a first embodiment of the present invention.

Hereinafter, a pressure sensor to which an embodiment of the invention is applied will be described. FIG. 1 is a cross section drawing of a pressure sensor S1 in the embodiment, and description is made according to the drawing. The pressure sensor S1 is, for example, used for differential pressure measurement of DPF that is an exhaust cleaning filter of diesel-powered automobiles.

As shown in FIG. 1, a connector case 10 as a first case is produced by die forming of resin such as PPS (poly phenylene sulfide) or PBT (poly butylene terephthalate) and formed in an approximately cylindrical shape in the embodiment. A recess 11 is formed at one end portion (end portion at a lower side in FIG. 1) of the connector case 10 as the resin case.

A sensor element 20 for pressure detection is set on a bottom of the recess 11.

The sensor element 20 is an element of a semiconductor diaphragm type, in which a diaphragm as a pressure receiving surface is provided. Pressure received by the diaphragm is converted into an electric signal by a gage resistance formed on a surface of the diaphragm. Then, the electric signal is outputted as a sensor signal.

The sensor element 20 is integrated to a base 20a comprising glass by anode bonding and the like, and the base 20a is adhered to the bottom of the recess 11 so that thereby the sensor element 20 is mounted on the connector case 10.

A plurality of metal rod terminals 12 for electrically connecting between the sensor element 20 and an external circuit are pierced through the connector case 10.

In the embodiment, the terminal 12 comprises a material of brass that has been subjected to plating (for example, Ni plating), and held in the connector case 10 by integrally molding with the connector case 10 by insert molding.

An end portion at one end side (lower end side in FIG. 1) of each of the terminals 12 is disposed in a manner of protruding from the bottom of the recess 11 in the periphery of the region where the sensor element 20 was mounted. On the other hand, an end portion at the other end side (upper end side in FIG. 1) of each terminal 12 is exposed in an opening 16 at the other end side of the connector case 10.

The one end portion of each terminal 12 protruding in the recess 11 and the sensor element 20 are wired and electrically connected by a bonding wire 13 of gold or aluminum. The electrical connection structure between the sensor element 20 and the bonding wire 13 described herein is a portion described in detail later.

A sealing agent 14 comprising silicone base resin and the like is provided in the recess 11, which seals a gap between a root of the terminal 12 protruding into the recess 11 and the connector case 10.

At a side of one surface 10a of the connector case 10 as a housing, a gel protection layer 15 is provided such that it covers roots of the sensor element 20, bonding wires 13 and terminals 12.

On the other hand, in FIG. 1, the other end portion (end portion at an upper side in FIG. 1) side of the connector case 10 includes an opening 16, and the opening 16 is formed as a connector portion for electrically connecting the other end side of the terminals 12 to the external circuit (ECU of the vehicle and the like) via an external wiring member (not shown) such as a wiring harness.

That is, the other end side of each terminal 12 exposed in the opening 16 can be electrically connected to the outside by the connector portion. Thus, a signal is transmitted between the sensor element 20 and the outside via the bonding wires 13 and the terminals 12.

As shown in FIG. 1, a housing 30 as a second case is assembled to the one end portion of the connector case 10. Specifically, it is configured that a reception recess 30a as an accommodation concavity is formed in the housing 30, and the one end side of the connector case 10 is inserted into the reception recess 30a, thereby the housing 30 is assembled to the connector case 10.

A casing 100 that is formed by integrally assembling the connector case 10 as the first case to the housing 30 as the second case is thus configured, and the sensor element 20 is provided in the casing 100.

The housing 30 comprises a metal material containing, for example, aluminum (Al) as a main component, and has a pressure introduction hole 31 for introducing measurement pressure from a measurement object, and a screw portion 32 for fixing the pressure sensor S1 to the measurement object. As described above, the measurement object includes the DPF that is the exhaust cleaning filter of the diesel-powered automobiles, and the measurement pressure includes differential pressure of the DPF.

Furthermore, the reception recess 30a in the housing 30 has one surface 30b facing an end face 10a of the connector case 10. The connector case 10 is contacted to the one surface 30b, thereby positioning of the connector case 10 is performed.

An annular groove (O-ring groove) 17 is formed on the end face 10a of the connector case 10 such that it encloses an outer edge of the pressure introduction hole 31, and an O-ring 18 is set in the groove 17, so that a fluid as a measurement object introduced from an interface between the end face 10a of the connector case 10 and the one surface 30b of the housing 30 does not leak.

As shown in FIG. 1, an end portion at a side of the reception recess 30a in the housing 30 is caulked to the one end portion of the connector case 10, thereby a caulking portion 36 is formed, and as a result the housing 30 is fixed to and integrated with the connector case 10.

In the pressure sensor S1 configured by assembling the connection case 10 with the housing 30 in this way, once the fluid as the measurement object is introduced through the pressure introduction hole 31, pressure of the fluid is applied to the sensor element 20, bonding wires 13, and terminals 12 via the gel protection layer 15.

Figure 2:
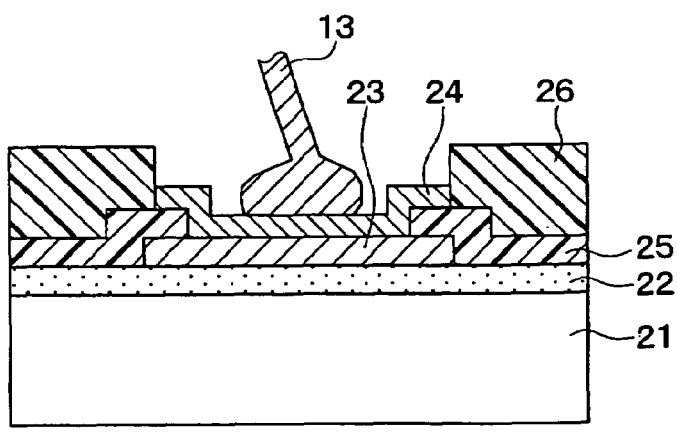
FIG. 2 is a partially enlarged cross sectional view showing a connection portion between a sensor element and a bonding wire in the pressure sensor according to the first embodiment.

Next, an electrical connection structure between the sensor element 20 and the bonding wires 13 in the pressure sensor S1 configured as above is described. FIG. 2 is a diagram showing a section structure of an electrical connection portion between the sensor element 20 and the bonding wires 13.

As shown in FIG. 2, an insulating film 22 comprising SiN is formed on a surface of the semiconductor chip 21 as a semiconductor substrate on which the sensor element 20 has been formed. An Al film 23 as a first metal film is formed on a surface of the insulating film 22. The Al film 23, which corresponds to a first metal film, is in a structure where it is electrically connected to a desired region of the sensor element 20 through a not-shown contact hole formed in the insulating film 22.

An Au film 24 as a second metal film having corrosion resistance is formed on a surface of the Al film 23. The Au film 24, which corresponds to a second metal film in the invention, is formed on an exposed portion of the first protection film 25 formed on the surfaces of the insulating film 22 and the Al film 23, that is, it is formed on a surface of a region as a pad in the Al film 23 and the periphery of the pad in the first protection film 25.

Specifically, it is configured that while the second protection film 26 comprising polyimide is formed on the surface of the first protection film 25, the second protection film 26 is not formed on the region as the pad in the Al film 23 and the periphery of the region and the Al film is exposed therein; and a structure where the Au film 24 is formed on the exposed region as the pad and the periphery thereof is made. Thus, in the configuration, an end portion of the Au film 24 approximately corresponds to an end portion of the second protection film 26.

The Au film 24 has high adhesion force to the Al film 23 and the first protection film 25 comprising SiN by being subjected to treatment for improving the adhesion force as described later.

In the structure, the bonding wires 13 are bonded to the surface of the Au film 24, and the bonding wires 13 are electrically bonded to the sensor element 20 formed on the semiconductor chip 21 via the Au film 24 and the Al film 23.

Then, a manufacturing method of the pressure sensor S1 in the embodiment is described. However, since a basic manufacturing method of the pressure sensor S1 is same as in the conventional method, description herein is made on the electrical connection portion between the sensor element 20 and the bonding wires 13, which is a feature of the invention.

FIG. 3 shows a manufacturing process of the electrical connection portion between the sensor element 20 and the bonding wire 13 as shown in FIG. 2.

Figure 3A:
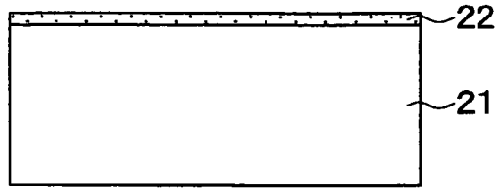
FIGS. 3A to 3G are partially enlarged cross sectional views explaining a method for manufacturing the sensor according to the first embodiment.
Figure 3B:
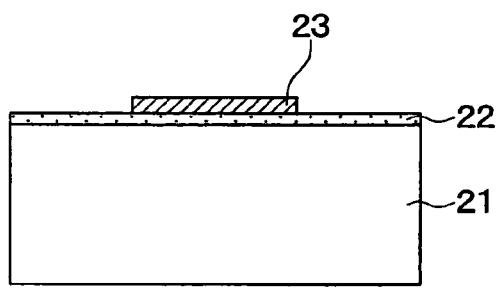

First, the sensor element 20 such as a gage resistance is formed on the semiconductor chip 21 in a conventionally known method, and then a diaphragm is formed in a method such as electrochemical etching. Then, as shown in FIG. 3A, the insulating film 22 is formed, and then as shown in FIG. 3B, the Al film 23 that is the first metal film is formed by deposition and the like, and then patterned to be left in a desired position.

Figure 3C:
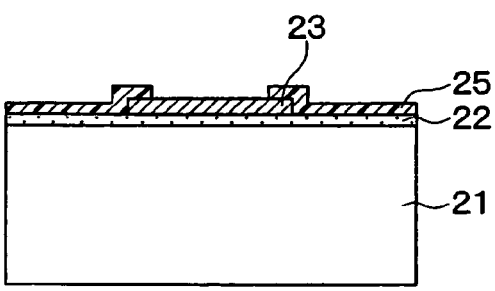

Subsequently, as shown in FIG. 3C, the first protection film 25 comprising a silicon nitride film or films of a silicon oxide film and a silicon nitride film stacked thereon is deposited on the surfaces of the Al film 23 and the insulating film 22, and then a portion of the first protection film 25 formed over the region as the pad in the Al film 23 is removed by photo-etching and the like. Thus, the region as the pad in the Al film 23 is in an exposed condition.

Figure 3D:
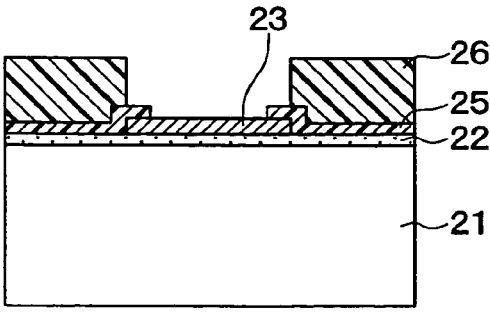

Next, as shown in FIG. 3D, the second protection film 26 comprising polyimide is deposited, and then a portion of the second protection film 26 formed on the region as the pad in the Al film 23 and a portion formed on the first protection film 25 situated on the periphery of the region are removed by photo-etching and the like. Thus, the region as the pad in the Al film 23 and the first protection film 25 situated on the periphery of the region are in an exposed condition.

Figure 3E:
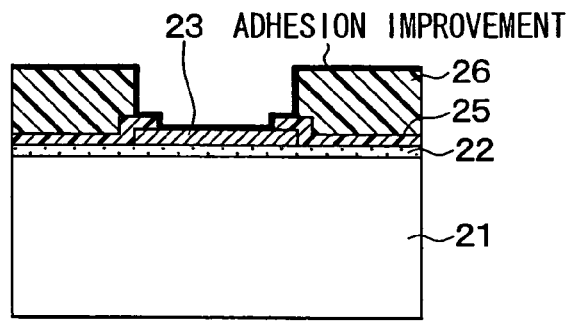

Then, in parallel-plate plasma processing apparatus, while it is not shown, plasma processing is performed in a condition of a gas atmosphere comprising argon (Ar) or nitrogen ($N_2$) and fluorocarbon ($CF_4$). Thus, as shown in FIG. 3E, adhesion force of the Al film 23, first protection film 25 and second protection film 26, which are bases of the Au film 24 formed later, can be changed.

Specifically, in the Al film 23 and the first protection film 25, adhesion force to the Au film 24 is secured; and in the second protection film 26, adhesion force to the Au film 24 is reduced. The mechanism of such change of adhesion force has not been clarified, however, it is considered that in the second protection film 26 comprising polyimide, since carbon in the second protection film 26 is bonded with fluorine in the atmosphere and into a stable state, adhesion force to the Au film is not obtained when the Au film 24 is formed thereon. In the Al film 23 and the first protection film 25 comprising SiN, it is considered that an oxide film that is naturally formed on a surface is removed by vapor treatment, and fluorine is remained in the portion from which the oxide has been removed, and the fluorine acts to improve adhesion force when the Au film 24 is formed. In particular, it is considered that when the Au film 24 is formed, Au is moved into Al by an effect of the remained fluorine, which results in metal-to-metal bonding, consequently adhesion force is improved.

If the plasma processing apparatus herein is not only used in this process, but also used continuously from a process before the process, and respective processes are continuously performed in the plasma processing apparatus, air exposure of the semiconductor chip 21 can be prevented, therefore particles and the like contained in the air can be prevented from being adhered to the surface of the semiconductor chip.

Figure 3F:
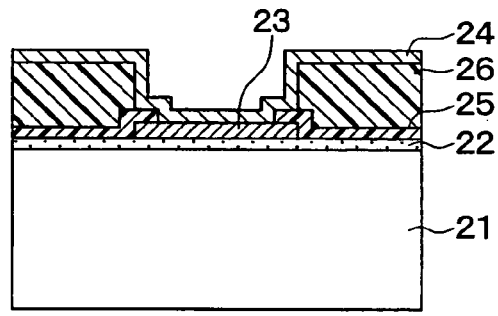
Figure 3G:
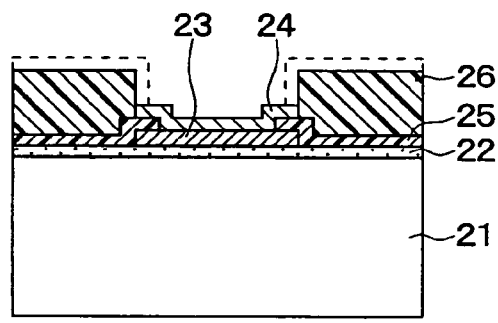

Subsequently, as shown in FIG. 3F, the Au film 24 is deposited on the surfaces of the Al film 23, first protection film 25 and second protection film 26 in a sputter process or a vacuum-deposition process. Then, a fluid having original pressure of 1 MPa or more such as water is contacted to the surface of the semiconductor chip 21, thereby as shown in FIG. 3G, a portion of the Au film 24 formed on the surface of the second protection film 26 having weak adhesion force is separated, consequently the Au film is remained only on the surfaces of the Al film 23 and the first protection film 25.

Then, the bonding wire 13 is bonded to the surface of the Au film 24; as a result the electrical connection structure as shown in FIG. 2 is completed.

According to the manufacturing method of the pressure sensor S1 of the embodiment described hereinbefore, treatment of changing adhesion force of the Al film 23, the first protection film 25 and the second protection film 26 as the bases of the Au film 24 is performed. Therefore, the Au film 24 on the second protection film 26 of which the adhesion force is reduced can be separated, consequently the Au film 24 can be formed only on the surfaces of the Al film 23 and the first protection film 25 of which the adhesion force is secured.

Moreover, the Al film 23 and the first protection film 25 are in a condition that they are bonded with the Au film 24 with high adhesion force by the treatment of changing adhesion force. Therefore, entering of corrosion medium into a pad side through an interface between the Au film 24 and the first protection film 25 can be prevented; consequently corrosion of the pad can be prevented.

Second Embodiment

A second embodiment of the invention is described. While the case that the Al film 23 is used as the first metal film was described in the first embodiment, when the Al film 23 is used, self diffusion of atoms may occur at grain boundaries due to heat treatment after forming the Al film 23, which sometimes causes gathering of the atoms in the surface of the Al film 23 and formation of a protrusion called hillock (hereinafter, referred to as hillock) 23a. Height of the hillock 23a as a surface protrusion of the aluminum film 23 sometimes reaches 2 µm to 3 µm.

Figure 4A:
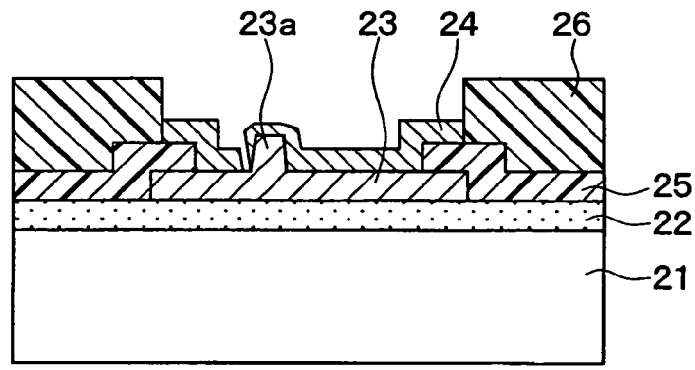
FIGS. 4A and 4B are partially enlarged cross sectional views showing a connection portion between a sensor element and a bonding wire in a pressure sensor according to a second embodiment of the present invention.
Figure 4B:
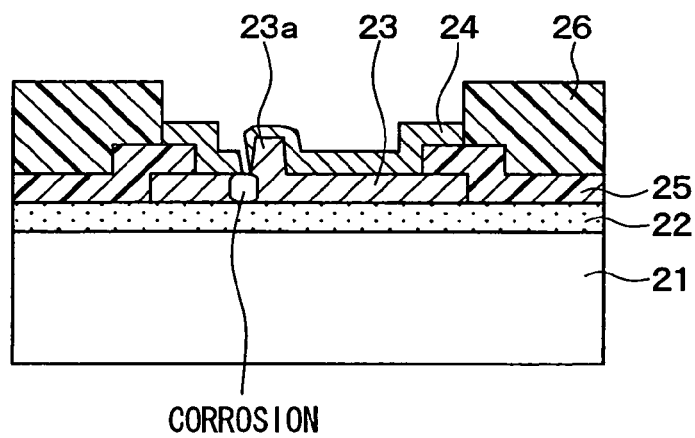

When the height of the hillock 23a is increased, a problem may occur as shown in a cross section drawing of a connection structure shown in FIG. 4A: the hillock 23a reduces covering performance of a film including the Au film that is the second metal film, therefore the Al film 23 can not be protected from a corrosive atmosphere in the corrosive atmosphere, consequently a portion that has not been sufficiently covered is corroded, for example, as shown in a cross section diagram of the connection structure shown in FIG. 4B. The method according to the second embodiment is to prevent the problem.

Figure 5:
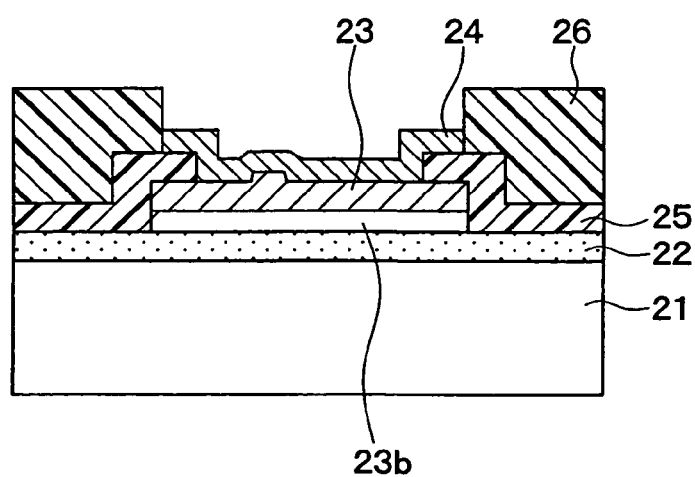
FIG. 5 is a partially enlarged cross sectional view showing the connection portion between the sensor element and the bonding wire in the pressure sensor according to the second embodiment.

FIG. 5 is a cross section diagram of an electrical connection structure in a bonding portion between a sensor element and a bonding wire in a pressure sensor of the embodiment. The embodiment is an embodiment in which the electrical connection structure in the bonding portion is changed from that in the first embodiment, but a basic structure of the pressure sensor is same as in the first embodiment, therefore only different portions from the first embodiment are described.

As shown in FIG. 5, a Ti film 23b is formed on the surface of the insulating film 22, then the Al film 23 is formed on the Ti film 23b, thereby the first metal film is configured.

When the Ti film 23b is used in this way, since Ti has high orientation, orientation of the Al film 23 formed thereon can be improved compared with the case that the Al film is directly formed on the insulating film 22, consequently the Al film can be thermally stabilized. Therefore, the self diffusion of Al due to heat treatment is hard to occur; consequently height of the hillock 23a becomes less than 0.5 µm.

When the height of the hillock 23a is made to be less than 0.5 µm, even if the Au film 24 that is the second metal film is formed using typical sputter apparatus, covering can be sufficiently made even over the periphery of the hillock 23a. Therefore, the Al film 23 can be prevented from being corroded even if it is exposed to the corrosive atmosphere.

Third Embodiment

A third embodiment of the invention is described. The invention is to reduce the height of the hillock 23a formed in the Al film 23, as in the case of the second embodiment.

Figure 6:
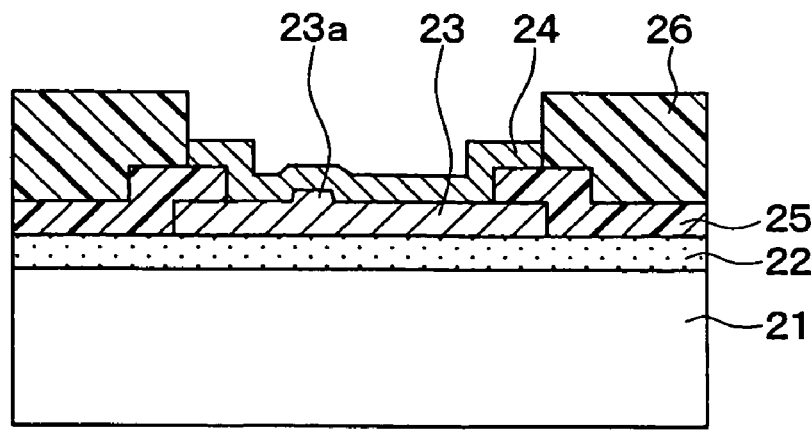
FIG. 6 is a partially enlarged cross sectional view showing a connection portion between a sensor element and a bonding wire in a pressure sensor according to a third embodiment of the present invention.

FIG. 6 is a cross section drawing of an electrical connection structure in a bonding portion between a sensor element and a bonding wire in a pressure sensor of the embodiment. The embodiment is an embodiment in which the electrical connection structure in the bonding portion is changed from that in the first embodiment, but a basic structure of the pressure sensor is same as in the first embodiment, therefore only different portions from the first embodiment are described.

In a connection structure shown in FIG. 6, the Al film 23 is changed from a pure Al film to an alloy film containing Al as a main component such as Al—Si—Cu. Specifically, the Al film 23 is configured by using an alloy of Al—Si—Cu containing Al as a main component, Si of 0.01% to 4% (for example, 0.4%), and Cu of 0.01% to 5% (for example, 1%).

Such an Al alloy is thermally stable compared with pure Al. Therefore, the Al film 23 is configured by using the Al alloy, thereby the height of the hillock 23a can be decreased, and consequently the height of the hillock 23a is less than 0.5 µm.

When the height of the hillock 23a is less than 0.5 µm, even if the Au film 24 that is the second metal film is formed using typical sputter apparatus, covering can be sufficiently made even over the periphery of the hillock 23a. Therefore, the Al film 23 can be prevented from being corroded even if it is exposed to the corrosive atmosphere.

(Modifications)

In the embodiments, description was made on the case using the electrical connection structure in which the Au film 24 is formed on the surface of the Al film 23. However, such a structure was merely shown as an example, and other structures can be also used.

Figure 7:
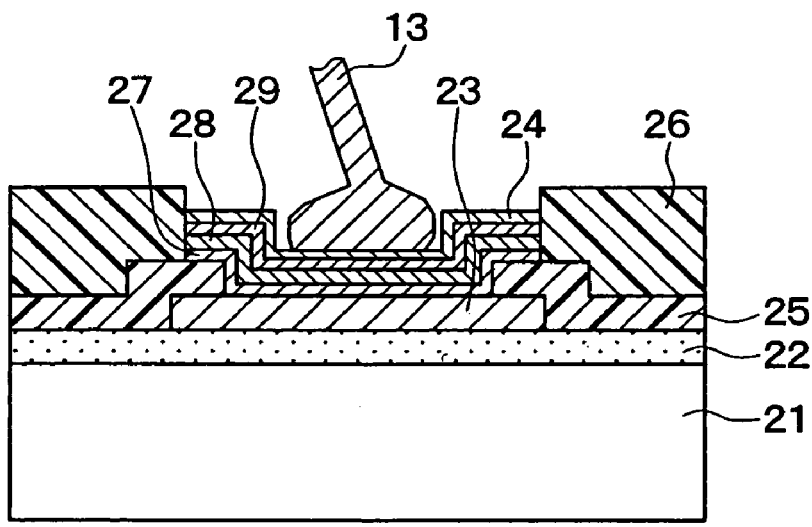
FIG. 7 is a partially enlarged cross sectional view showing a connection portion between a sensor element and a bonding wire in a pressure sensor according to a modification of the present invention.

For example, as shown in FIG. 7, a configuration where an Al film 27, a Ti film 28 and a Ni film 29 are disposed on the surface of the Al film 23, and then Au film 24 is disposed thereon, that is, a configuration where the second metal film is configured by a stacked film of many types of metals can be also used. Alternatively, a configuration where only the Ti film 28 is interposed between the Al film 23 and the Au film 24 can be also used.

While the invention was described by giving the metal containing Al as the main component for the first metal film as an example in each of the embodiments, the invention can be also applied to the case of using other metals, for example, a metal containing Cu as the main component. In the first and second embodiments, at least part of the first metal film is configured by the Al film 23. The Al film 23 may be not only the film comprising pure Al, but also a film comprising an Al alloy containing Al as the main component.

Moreover, the described materials of the first protection film 25 and the second protection film 26 were merely shown as an example, and the first protection film 25 may not necessarily comprise SiN, and the second protection film 26 may not necessarily comprise polyimide. The point is that in the treatment for changing the adhesion force, the first protection film 25 may comprise a material of which the adhesion force is improved, and the second protection film 26 can comprise a material of which the adhesion force is reduced. In this case, in a point of view of the material of which the adhesion force is improved, the first protection film 25 may comprise any material, if the material is a material of which the adhesion force is not reduced even if fluorine is remained after the treatment, that is, a material containing no carbon. Moreover, the second protection film 26 may comprise any material of which the adhesion force is reduced, such as an organic resin material.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a pressure sensor comprising the steps of:
    preparing a semiconductor substrate having a sensor element thereon, the sensor element generating a detection signal in accordance with pressure as a detection object;
    forming an insulation film having a contact hole on a surface of the semiconductor substrate, the contact hole connecting to the sensor element;
    forming a first metal film on a predetermined part of the insulation film, the first metal film electrically connecting to the sensor element through the contact hole;
    forming a first protection film on the first metal film and the insulation film to expose a pad region of the first metal film;
    forming a second protection film made of organic resin on the first metal film and the first protection film to expose the pad region of the first metal film and a part of the first protection film disposed around the pad region;
    performing reduction treatment of adhesive force on a surface of the second protection film after the step of forming the second protection film, the adhesive force being between the second protection film and a second metal film thereon;
    forming the second metal film on the pad region of the first metal film and the part of the first protection film disposed around the pad region after the step of performing the reduction treatment; and
    removing a part of the second metal film disposed on the surface of the second protection film.

2. The method according to claim 1, wherein
the step of performing the reduction treatment provides to increase adhesive force between the second metal film and the pad region of the first metal film or the part of the first protection film disposed around the pad region.

3. The method according to claim 1, wherein
the first metal film is made of aluminum based material, and
the second metal film includes a gold film.

4. The method according to claim 3, wherein
the second metal film further includes at least one of an aluminum film, a titanium film and a nickel film,
the gold film in the second metal film is disposed on at least one of the aluminum film, the titanium film and the nickel film.

5. The method according to claim 1, wherein
the step of forming the second metal film is performed by a sputtering method or a vapor deposition method.

6. The method according to claim 1, wherein
the step of performing the reduction treatment of adhesive force is a plasma processing in a gas atmosphere including $CF_4$ gas and argon gas or nitrogen gas.

7. The method according to claim 1, wherein
the first metal film includes a titanium film and an aluminum based film, and
the step of forming the first metal film includes steps of:
    forming the titanium film; and
    forming the aluminum based film on the titanium film.

8. The method according to claim 1, wherein
the first metal film includes an aluminum based film, and
the aluminum based film includes silicon or copper.

9. The method according to claim 1, wherein
the first metal film has a surface protrusion, a height of which is equal to or smaller than 0.5 µm.

10. The method according to claim 9, wherein
the first metal film includes a titanium film and an aluminum based film,
the step of forming the first metal film includes steps of:
    forming the titanium film; and
    forming the aluminum based film on the titanium film, and
the height of the surface protrusion is reduced by orientation of the titanium film.

11. The method according to claim 9, wherein
the first metal film includes an aluminum-silicon-copper alloy film, and
the height of the surface protrusion is reduced by thermal stability of the aluminum-silicon-copper alloy film.

12. The method according to claim 1, wherein
the first protection film is made of silicon oxides or silicon nitrides, and
the second protection film is made of polyimide.

13. A method for manufacturing a pressure sensor comprising the steps of:
preparing a semiconductor substrate having a sensor element thereon, the sensor element generating a detection signal in accordance with pressure as a detection object;
forming an insulation film having a contact hole on a surface of the semiconductor substrate, the contact hole connecting to the sensor element;
forming a first metal film on a predetermined part of the insulation film, the first metal film electrically connecting to the sensor element through the contact hole;
forming a first protection film on the first metal film and the insulation film to expose a pad region of the first metal film;
forming a second protection film made of organic resin on the first metal film and the first protection film to expose the pad region of the first metal film and a part of the first protection film disposed around the pad region;
performing increase treatment of adhesive force on a surface of the pad region of the first metal film and on the part of the first protection film disposed around the pad region after the step of forming the second protection film, the adhesive force being between the first metal film or the first protection film and a second metal film thereon;
forming the second metal film on the pad region of the first metal film and the part of the first protection film disposed around the pad region after the step of performing the increase treatment; and
removing a part of the second metal film disposed on the surface of the second protection film.

14. The method according to claim 13, wherein
the first metal film is made of aluminum based material, and
the second metal film includes a gold film.

15. The method according to claim 14, wherein
the second metal film further includes at least one of an aluminum film, a titanium film and a nickel film,
the gold film in the second metal film is disposed on at least one of the aluminum film, the titanium film and the nickel film.

16. The method according to claim 13, wherein
the step of forming the second metal film is performed by a sputtering method or a vapor deposition method.

17. The method according to claim 13, wherein
the step of performing the increase treatment of adhesive force is a plasma processing in a gas atmosphere including $CF_4$ gas and argon gas or nitrogen gas.

18. The method according to claim 13, wherein
the first metal film includes a titanium film and an aluminum based film, and
the step of forming the first metal film includes steps of:
forming the titanium film; and
forming the aluminum based film on the titanium film.

19. The method according to claim 13, wherein
the first metal film includes an aluminum based film, and
the aluminum based film includes silicon or copper.

20. The method according to claim 13, wherein
the first metal film has a surface protrusion, a height of which is equal to or smaller than 0.5 μm.

21. The method according to claim 20, wherein
the first metal film includes a titanium film and an aluminum based film,
the step of forming the first metal film includes steps of:
forming the titanium film; and
forming the aluminum based film on the titanium film, and
the height of the surface protrusion is reduced by orientation of the titanium film.

22. The method according to claim 20, wherein
the first metal film includes an aluminum-silicon-copper alloy film, and
the height of the surface protrusion is reduced by thermal stability of the aluminum-silicon-copper alloy film.

23. The method according to claim 13, wherein
the first protection film is made of silicon oxides or silicon nitrides, and
the second protection film is made of polyimide.

* * * * *